United States Patent
Incarnati et al.

(10) Patent No.: US 7,630,266 B2
(45) Date of Patent: Dec. 8, 2009

(54) TEMPERATURE COMPENSATION OF MEMORY SIGNALS USING DIGITAL SIGNALS

(75) Inventors: Michele Incarnati, Gioia dei Marsi (IT); Giovanni Santin, Vazia (IT)

(73) Assignee: Micron Technology, Inc., Boise, ID (US)

( * ) Notice: Subject to any disclaimer, the term of this patent is extended or adjusted under 35 U.S.C. 154(b) by 286 days.

(21) Appl. No.: 11/893,035

(22) Filed: Aug. 14, 2007

(65) Prior Publication Data
US 2008/0137460 A1   Jun. 12, 2008

(30) Foreign Application Priority Data
Dec. 6, 2006   (IT)   .......................... RM2006A0652

(51) Int. Cl.
*G11C 7/04*   (2006.01)
(52) U.S. Cl. ...................................... 365/211; 365/212
(58) Field of Classification Search ................. 365/211, 365/212, 210.1
See application file for complete search history.

(56) References Cited

U.S. PATENT DOCUMENTS

| 5,731,742 | A * | 3/1998 | Wojewoda et al. | 331/44 |
| 6,954,394 | B2 * | 10/2005 | Knall et al. | 365/211 |
| 7,084,695 | B2 * | 8/2006 | Porter | 327/512 |
| 7,310,013 | B2 * | 12/2007 | Porter | 327/512 |

OTHER PUBLICATIONS

U.S. Appl. No. 11/891,949, filed Aug. 14, 2007, Macerola et al.

* cited by examiner

*Primary Examiner*—Son Dinh
*Assistant Examiner*—Hien N Nguyen
(74) *Attorney, Agent, or Firm*—Leffert Jay & Polglaze, P.A.

(57) ABSTRACT

A temperature sensor generates a digital representation of the temperature of the integrated circuit. A logic circuit reads the digital temperature and generates a multiple bit digital representation of an operational voltage and a multiple bit digital representation of a timing signal, both being functions of the integrated circuit temperature. A voltage generator converts the digital representation of the operational voltage to an analog voltage that biases portions of the integrated circuit requiring temperature compensated voltages. In one embodiment, the temperature compensated voltages bias memory cells. A timing generator converts the multiple bit digital representation of the timing signal to a logic signal.

31 Claims, 6 Drawing Sheets

TEMPERATURE COMPENSATION OF MEMORY SIGNALS USING DIGITAL SIGNALS

RELATED APPLICATION

This application claims priority to Italian Patent Application Serial No. RM2006A000652, filed Dec. 6, 2006, entitled "TEMPERATURE COMPENSATION OF MEMORY SIGNALS USING DIGITAL SIGNALS," which is commonly assigned.

TECHNICAL FIELD OF THE INVENTION

The embodiments of the present invention relate generally to temperature sensing and more particularly to temperature sensing in a memory device.

BACKGROUND OF THE INVENTION

It is sometimes desirable to know the internal temperature of integrated circuits. The integrated circuit temperature can be used to improve circuit operation by compensating signals that change from nominal operation when the chip temperature changes.

A memory device, such as a NAND flash memory, requires various voltages for programming and reading memory cell data. Programming a cell includes biasing the cell control gate with a programming voltage until the cell is at a desired threshold voltage. The cell is verified with a sense amplifier by applying that threshold voltage to the cell to determine if the cell turns on and conducts. If the cell does not turn on, it has not been programmed to the desired threshold.

During operation of an integrated circuit, the temperature varies due to both ambient temperature as well as the electrical operation of the integrated circuit. The temperature change can cause a change in the nominal operating characteristics of a memory cell. For example, a threshold voltage of 1V at room temperature may turn into a threshold voltage of 900 mV as the chip temperature increases. The change in voltage levels can have an impact on reading, programming, and verifying operations that are expecting a certain voltage.

For example, FIG. 1 illustrates a plot of a threshold voltage distribution, $V_t$. This graph shows typical effects of temperature on the $V_t$ distribution.

The dependence of the decision edge of a sense amplifier on the temperature affects the distribution width of the Vt through the spread of the program verify operation. The program verify operation may be performed at different temperatures such as T1 and T2. If the program algorithm provides a distribution width W, a programming algorithm performed at temperature T1 results in the first distribution 101 that is W wide and starts at pgm_vfy1. If the programming algorithm performs at temperature T2, a second distribution 103 that is W wide starts at pgm_vfy2. The total distribution 104 after the two program operations will be a distribution 104 that is D wide where $W_{tot} \geq W+\text{pgm\_vfy2}-\text{pgm\_vfy1}$. FIG. 1 illustrates the program verify spread 106 resulting from pgm_vfy2−pgm_vfy1.

For the reasons stated above, and for other reasons stated below which will become apparent to those skilled in the art upon reading and understanding the present specification, there is a need in the art for temperature compensation of signals in an integrated circuit.

DETAILED DESCRIPTION

Figure 1:
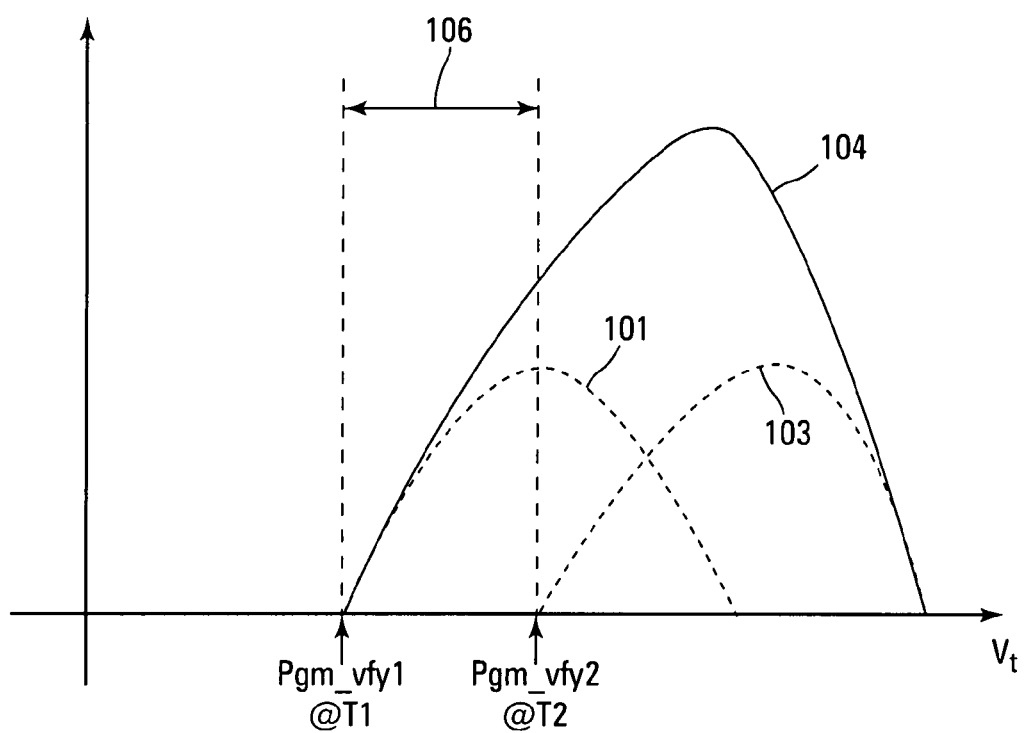
FIG. 1 shows a plot of threshold voltage distributions at different temperatures.

In the following detailed description, reference is made to the accompanying drawings that form a part hereof, and in which is shown, by way of illustration, specific embodiments. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the embodiments is defined only by the appended claims and equivalents thereof.

Figure 2:
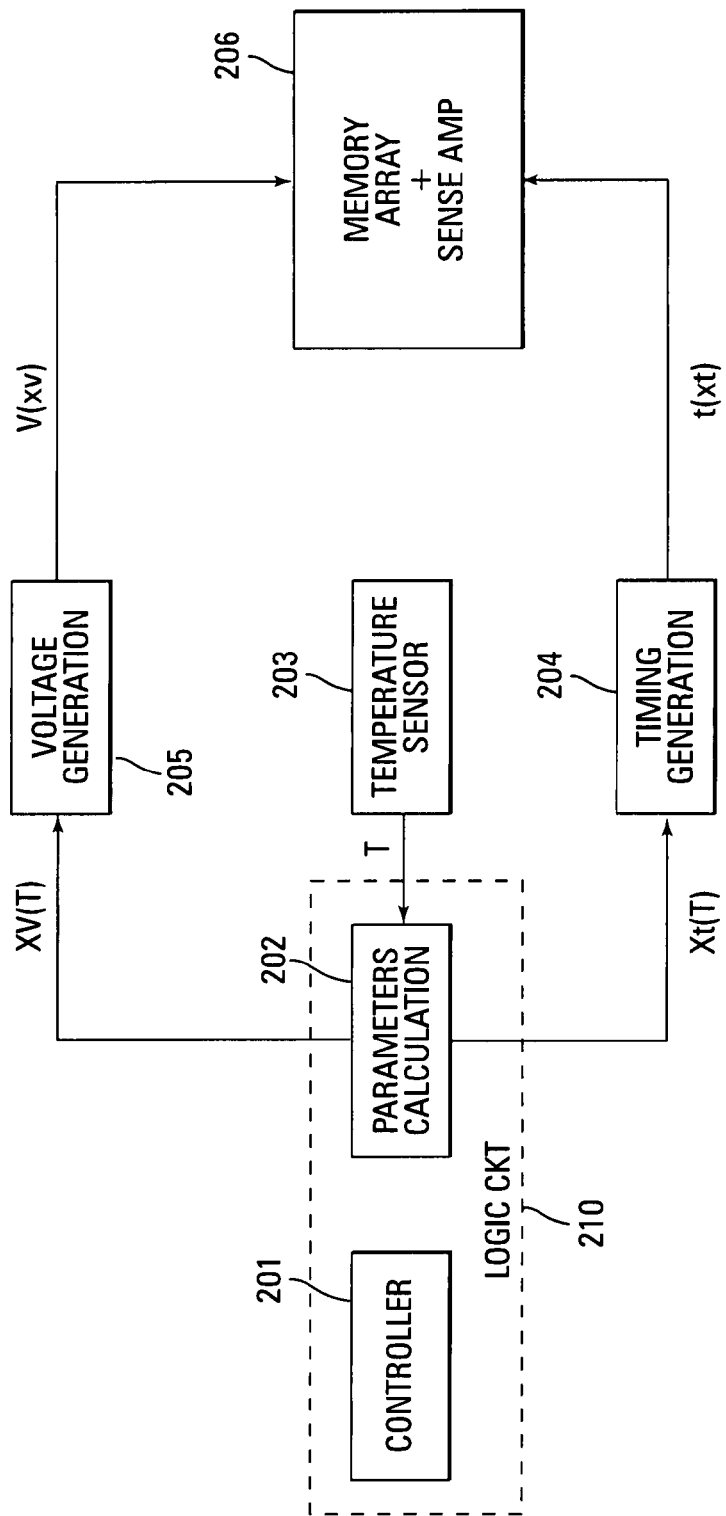
FIG. 2 shows a block diagram of one embodiment of a temperature compensation circuit in a memory device.

FIG. 2 illustrates a block diagram of one embodiment of a temperature compensation circuit 200 in a memory device. In one embodiment, the memory device is a NAND flash memory. However, the present embodiments are not limited to any one type of memory. Any type of non-volatile memory or volatile memory can be substituted for the NAND flash memory including NOR flash memory and dynamic random access memory (DRAM).

The temperature sensor circuit 203 generates a digital representation, T, of the temperature of the integrated circuit. The digital representation may be an actual temperature of the integrated circuit or a digital signal that is proportional to the temperature that can then be used by other circuits as an indication of the temperature.

The temperature sensor circuit 203 encompasses any type of temperature sensor. For example, a thermistor varies its resistance in response to temperature changes. An analog-to-digital circuit would then change the analog resistance to a digital representation of the temperature. The embodiments of the present invention are not limited to any one temperature sensor circuit.

The logic circuit 210 reads the temperature representation from the temperature sensor 203. The logic circuit 210 is comprised of a controller circuit 201 and a parameter calculation block 202.

The controller circuit 201 can be the controller of the memory device such as a state machine that controls the memory operations (i.e., program, erase, read) of the memory device. Alternate embodiments may use a controller circuit that is dedicated to the temperature compensation control operation.

The parameter calculation block 202 is comprised of a hardware circuit, a software module, or a combination of the two. This block 202 is responsible for generating the compensation parameters as a function of temperature. In the embodiment of FIG. 2, these digital parameters are the digital representation of the vector of voltages V(q), referred to as xv(T), and the digital representation of the vector of timings t(q), referred to as xt(T). Alternate embodiments may generate additional parameters, depending on the type of memory. The digital words representing the voltage and the timing signals are not limited to any one quantity of bits. The greater the quantity of bits, the greater the granularity for generating the analog voltages and times, respectively.

In one embodiment, the parameter calculation block 202 includes a look-up table, stored in memory, of the digital representations of the voltages and times required for different temperatures and memory operations (i.e., programming, erasing, reading). For example, the table can have columns of temperatures and memory functions matched up with their respective word line voltage, bit line voltage, sensing time, and sensing delay time. The table of values is generated during manufacture and testing of the integrated circuit.

In another embodiment, the look-up table includes voltage/temperature offsets instead of the actual digital voltage/time representations. In still another embodiment, the parameter calculation block 202 dynamically generates appropriate voltages and times, as a function of the temperature, with an algorithm.

A voltage generation circuit 205 generates the temperature compensated voltages in response to the digital signal xv(T). These voltages are illustrated generically as V(xv). In one embodiment, the voltage generation circuit 205 generates the word line voltage, $V_{wl}(xv)$. Alternate embodiments can generate other voltages necessary for temperature compensated operation of a memory array and sense amplifier 206. These voltages can include the bit line sense voltage and the bit line precharge voltage.

Figure 3:
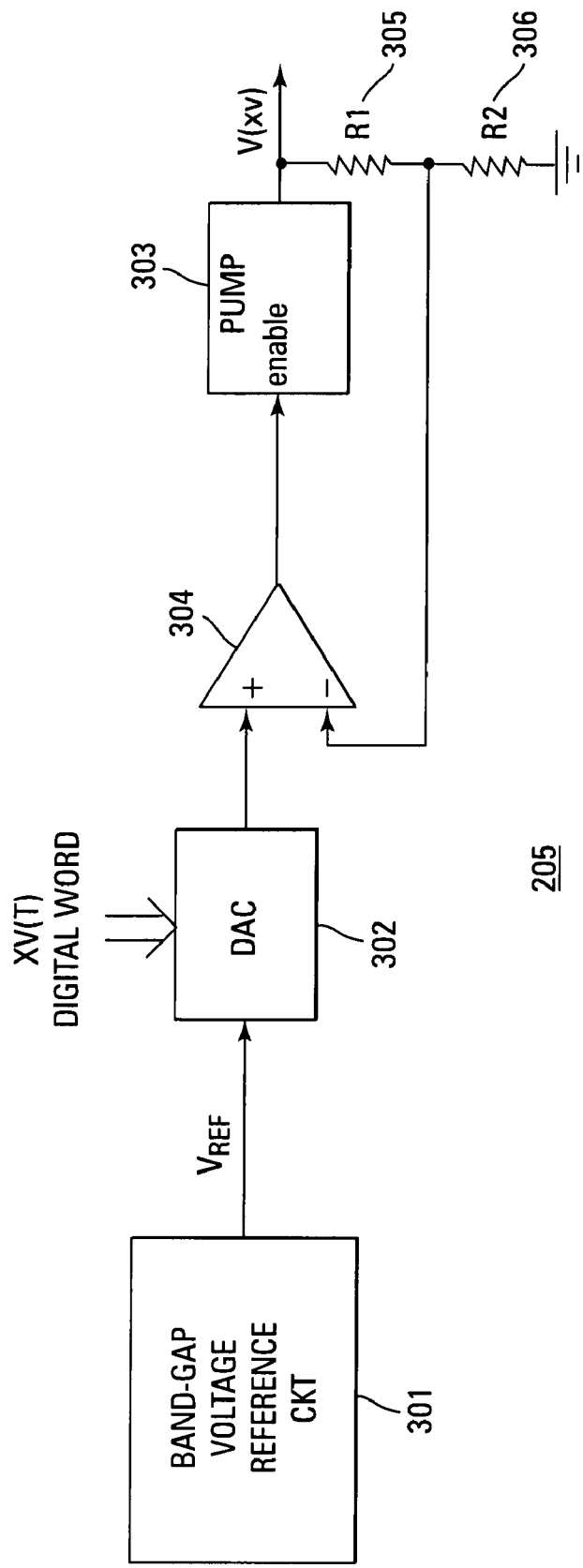
FIG. 3 shows a block diagram of one embodiment of a voltage generation circuit in accordance with the embodiment of FIG. 2.

FIG. 3 illustrates one embodiment of a voltage generation circuit 205. In this embodiment, the circuit is a digital-to-analog converter 302 that generates an analog voltage output as a function of the digital word input xv(T). The analog voltage is generated from a temperature invariant reference voltage $V_{ref}$. One embodiment generates the reference voltage from a band-gap voltage reference circuit 301. The digital-to-analog converter 302 can output a voltage in the range of 0V to $V_{ref}$, depending on the digital word input.

The analog voltage generated by the digital-to-analog converter 302 is input to a voltage regulator circuit having an operational amplifier 304 and a voltage pump 303. The regulated output voltage, V(xv), of the voltage pump 303 is in the range of 0V to $V_{out\_max}$. The resistor divider made up of resistors R1 305 and R2 306 translate the range of V(xv) into the range of the digital-to-analog converter. In other words, $V_{out\_max} * R2/(R1+R2) = V_{ref}$.

A timing generation circuit 204 generates the temperature compensated timing signals (i.e., sense time–$t_{sense}$) for the memory array and sense amplifier 206 in response to the multiple bit digital representation of the timing xt(T). The sense time, $t_{sense}$, in a non-volatile memory device, is the time between the start and end of the memory cell discharge to the bit line.

The multiple bit word, xt(T) is generated by the logic block 210 according to the temperature T. For example, if at 90° C. the sensing time is 5 μs and four bits are used to linearly code the sensing time from 0 to 16 μs, then xt(90° C.)=0101 (binary) and the time between the timing signal t(0101) will have the time between the start and end discharge pulses equal to 5 μs.

The output of the timing generation block 204, $t_{sense}=t(xt)$, is a logic signal comprising a set of pulses indicating the starting and ending times of the time period necessary for the cell to discharge the bit line. The pulses are separated by the time xt. The timing generation block 204, in combination with the logic block 210, thus uses the digital representation of the temperature to calculate the digital representation of the sensing time needed to compensate the temperature effect on the sensing circuit.

The present embodiments are not limited to any one method for generating t(xt). These methods can include using a digital counter with a clock reference, a monostable circuit trimmed by xt, or a dedicated routine in the controller circuit 201.

The memory array and sense amplifier circuit block 206 includes the memory cells that are arranged in an array fashion. Word lines are coupled to the control gates of rows of memory cells and bit lines are coupled to the columns of memory cells.

The bit lines are coupled to the sense amplifiers so that, after the control gate of an addressed cell is biased during a verify/read operation, its current is sensed on the bit line for the time period $t_{sense}$. The sensing operation determines the state of the cell.

Figure 4:
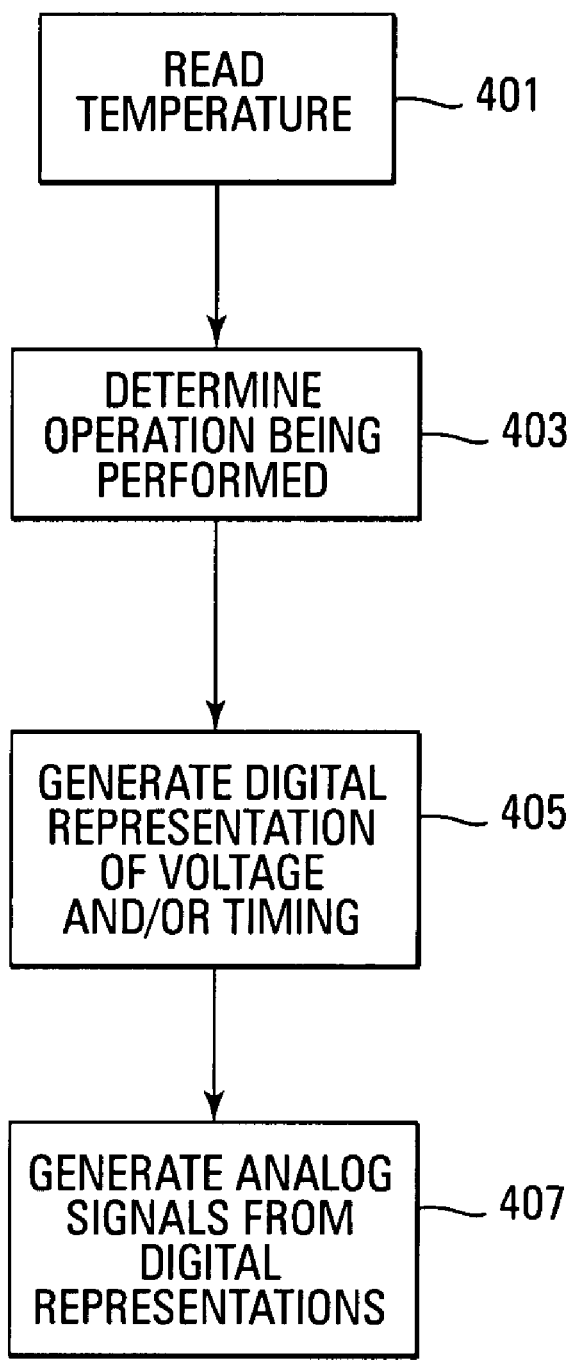
FIG. 4 shows a flowchart of one embodiment of a method for adjusting the voltage and timing of memory signals in response to temperature changes.

FIG. 4 illustrates a flow chart of one embodiment of a method for adjusting the voltage and/or timing of memory operation signals in response to temperature changes of the integrated circuit. This method refers to the block diagram of FIG. 2.

A digital indication of the temperature T, such as the actual temperature or a proportional indication, is read from the temperature sensor 401. The memory operation to be performed (i.e., erase, program, read) is then determined 403.

It is desirable to know the memory operation to be performed since different operations require different word line and bit line voltages as well as different timing requirements. Therefore, the parameter calculation block 202 of FIG. 2 needs this information to determine which digital representations of the voltage and timing to generate.

The parameter calculation block 202 then generates the digital representation of the voltage 405 as a function of temperature and based on the memory operation to be performed. The parameter calculation block 202 can also generate the digital representation of the memory operation timing as a function of temperature and based on the memory operation to be performed.

The analog voltage for the memory operation is then generated based on the digital representation 407. If the embodiment includes generating the memory operation timing, the timing signals are generated as well 407.

Figure 5:
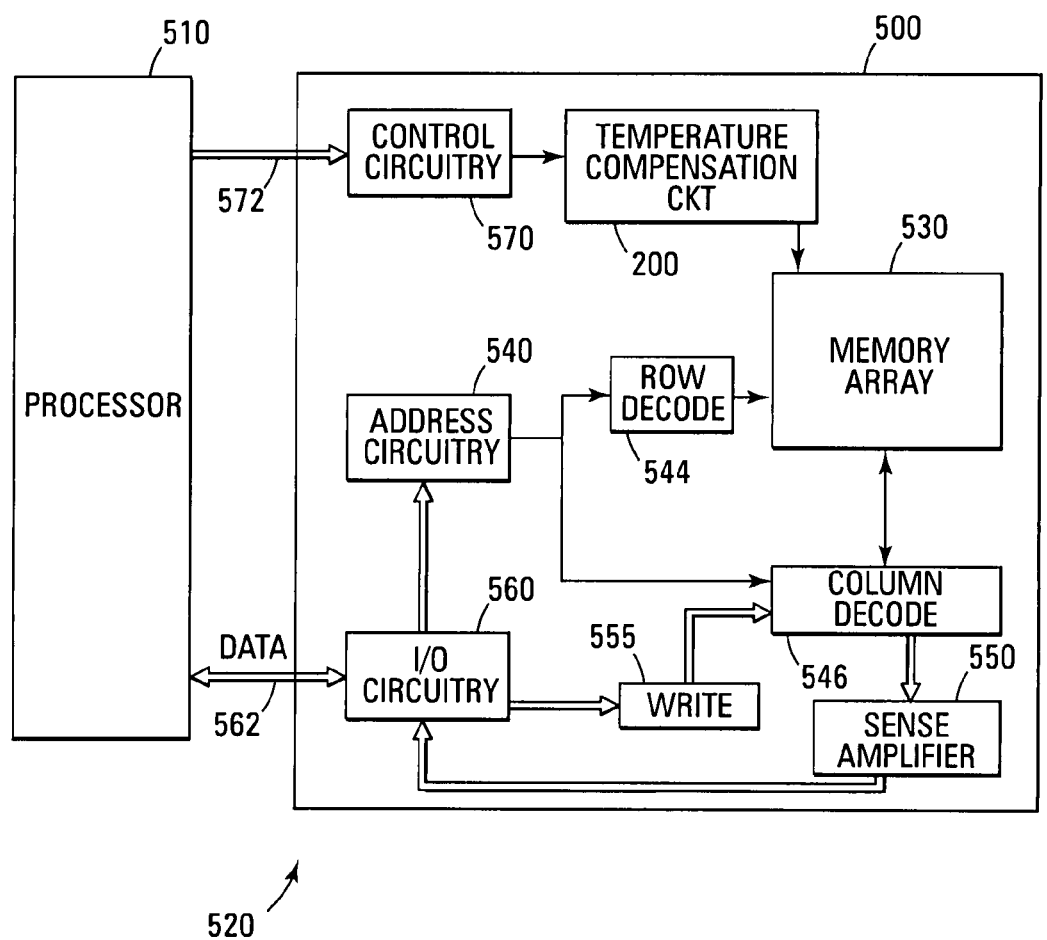
FIG. 5 shows a block diagram of one embodiment of a memory system incorporating the temperature compensation circuit of FIG. 2.

FIG. 5 illustrates a functional block diagram of a memory device 500 that can incorporate embodiments of the temperature compensation described herein. The memory device 500 is coupled to a controller 510. The controller 510 may be a microprocessor or some other type of controlling circuitry. The memory device 500 and the controller 510 form part of a memory system 520. The memory device 500 has been simplified to focus on features of the memory that are helpful in understanding the present invention. The memory and controller can be discreet devices, separate integrated circuits, a common device or a common integrated circuit.

The memory device includes an array of memory cells 530 that, in one embodiment, are non-volatile memory cells such as flash memory cells. The memory array 530 is arranged in banks of rows and columns. The control gates of each row of memory cells is coupled with a word line while the drain and source connections of the memory cells are coupled to bit lines. As is well known in the art, the connection of the cells to the bit lines depends on whether the array is a NAND architecture, a NOR architecture, an AND architecture, or some other array architecture.

An address buffer circuit 540 is provided to latch address signals provided over I/O connections 562 through the I/O circuitry 560. Address signals are received and decoded by row decoders 544 and column decoders 546 to access the memory array 530. It will be appreciated by those skilled in the art that, with the benefit of the present description, the number of address input connections and row/column decoders depends on the density and architecture of the memory array 530. That is, the number of addresses increases with both increased memory cell counts and increased bank and block counts.

The memory integrated circuit 500 reads data in the memory array 530 by sensing voltage or current changes in the memory array columns using sense/buffer circuitry 550. The sense/buffer circuitry, in one embodiment, is coupled to read and latch a row of data from the memory array 530. Data input and output buffer circuitry 560 is included for bi-directional data communication over the I/O connections 562 with the processor 510. Write circuitry 555 is provided to write data to the memory array.

Control circuitry 570 decodes signals provided on control connections 572 from the processor 510. These signals are used to control the operations on the memory array 530, including data read, data write, and erase operations. The control circuitry 570 may be a state machine, a sequencer, or some other type of controller. The control circuitry 570 of the present invention, in one embodiment, is responsible for executing the embodiments of the temperature compensation method.

The temperature compensation circuit 200 of FIG. 2 is shown coupled to the control circuitry 570. In another embodiment, this control circuitry 570 can be included in the temperature compensation circuit block 200.

The flash memory device illustrated in FIG. 5 has been simplified to facilitate a basic understanding of the features of the memory and is for purposes of illustration only. A more detailed understanding of internal circuitry and functions of flash memories are known to those skilled in the art. Alternate embodiments may include the flash memory cell of the present invention in other types of electronic systems.

Figure 6:
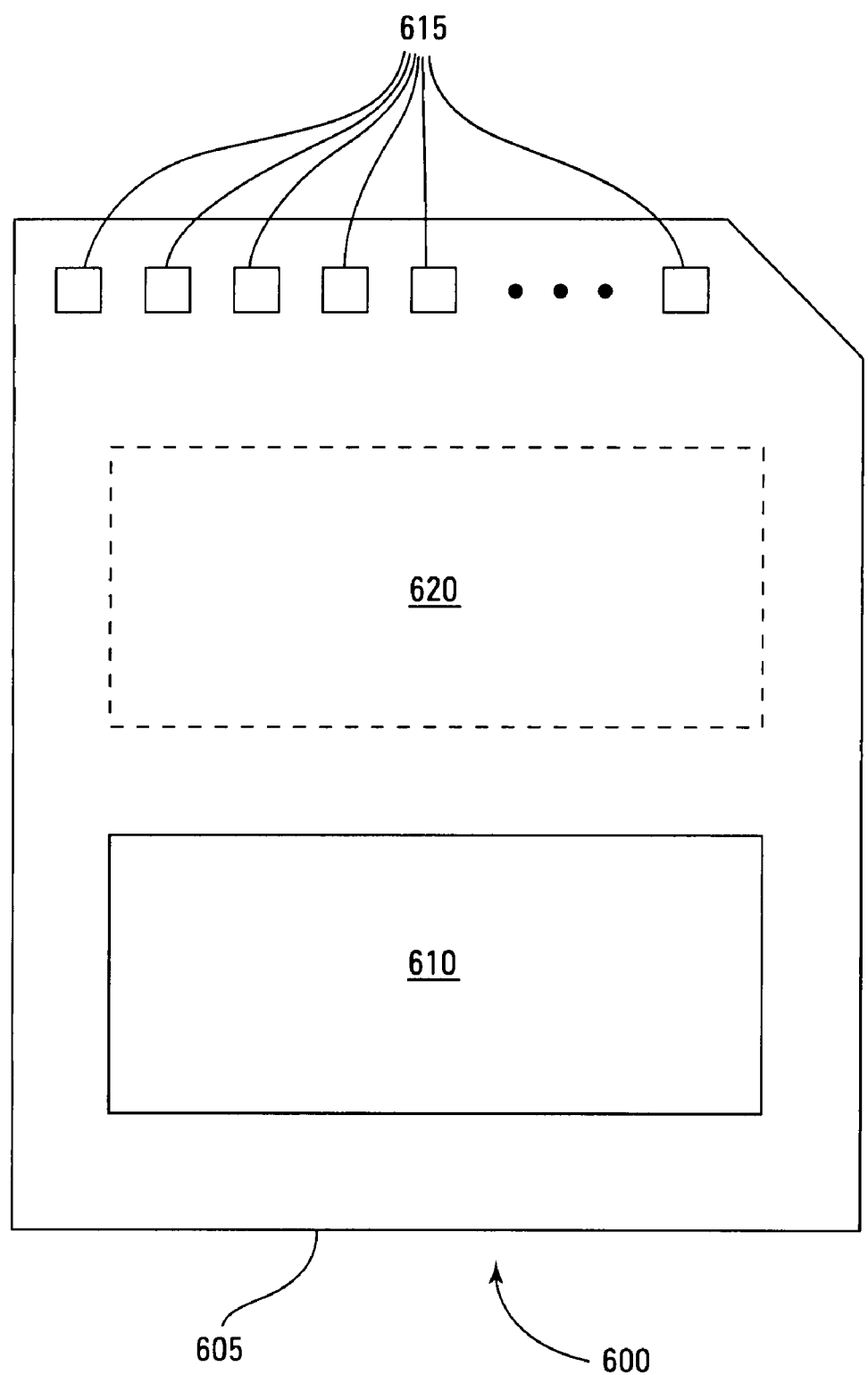
FIG. 6 shows a block diagram of one embodiment of a memory module incorporating the temperature compensation circuit of FIG. 2.

FIG. 6 is an illustration of a memory module 600 that incorporates the temperature compensation embodiments as discussed previously. Although the memory module 600 is illustrated as a memory card, the concepts discussed with reference to the memory module 600 are applicable to other types of removable or portable memory, e.g., USB flash drives. In addition, although one example form factor is depicted in FIG. 6, these concepts are applicable to other form factors as well.

The memory module 600 includes a housing 605 to enclose one or more memory devices 610 of the present invention. The housing 605 includes one or more contacts 615 for communication with a host device. Examples of host devices include digital cameras, digital recording and playback devices, PDAs, personal computers, memory card readers, interface hubs and the like. For some embodiment, the contacts 615 are in the form of a standardized interface. For example, with a USB flash drive, the contacts 615 might be in the form of a USB Type-A male connector. In general, however, contacts 615 provide an interface for passing control, address and/or data signals between the memory module 600 and a host having compatible receptors for the contacts 615.

The memory module 600 may optionally include additional circuitry 620. For some embodiments, the additional circuitry 620 may include a memory controller for controlling access across multiple memory devices 610 and/or for providing a translation layer between an external host and a memory device 610. For example, there may not be a one-to-one correspondence between the number of contacts 615 and a number of I/O connections to the one or more memory devices 610. Thus, a memory controller could selectively couple an I/O connection (not shown in FIG. 6) of a memory device 610 to receive the appropriate signal at the appropriate I/O connection at the appropriate time or to provide the appropriate signal at the appropriate contact 615 at the appropriate time. Similarly, the communication protocol between a host and the memory module 600 may be different than what is required for access of a memory device 610. A memory controller could then translate the command sequences received from a host into the appropriate command sequences to achieve the desired access to the memory device 610. Such translation may further include changes in signal voltage levels in addition to command sequences.

The additional circuitry 620 may further include functionality unrelated to control of a memory device 610. The additional circuitry 620 may include circuitry to restrict read or write access to the memory module 600, such as password protection, biometrics or the like. The additional circuitry 620 may include circuitry to indicate a status of the memory module 600. For example, the additional circuitry 620 may include functionality to determine whether power is being supplied to the memory module 600 and whether the memory module 600 is currently being accessed, and to display an indication of its status, such as a solid light while powered and a flashing light while being accessed. The additional circuitry 620 may further include passive devices, such as decoupling capacitors to help regulate power requirements within the memory module 600.

CONCLUSION

The temperature compensation apparatus embodiments provide memory array digitally generate voltages that have been adjusted for temperature. Another embodiment can digitally generate both voltages and timing that have been adjusted for temperature. Still another embodiment can generate only temperature compensated timing signals.

The word line voltage applied to a memory cell during a sensing operation can be compensated according to the integrated circuit temperature to keep the decision edge of the sense amplifier the same as during nominal temperature operation. This reduces the distribution widths experienced in the prior art operation of FIG. 1 where, if the word line voltage is applied the same at every temperature, the decision edge of the sense amplifier spreads. Additionally, the margin needed between the read and verify operations is reduced by reducing the dependence on temperature of the sensing discrimination.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A temperature compensation circuit in an integrated circuit having operational voltages, the circuit comprising:
a temperature sensing device for sensing a temperature of the integrated circuit;
a logic circuit, coupled to the temperature sensing device, for generating a digital representation of an operational voltage that is a function of the temperature; and
a voltage generator, coupled to the logic circuit, for generating an analog operational voltage in response to the digital representation of the operational voltage.

2. The circuit of claim 1 wherein the logic circuit is comprised of a controller circuit and a parameter calculation device.

3. The circuit of claim 1 wherein the voltage generator is comprised of a digital-to-analog converter.

4. The circuit of claim 1 wherein the integrated circuit is a memory device.

5. The circuit of claim 1 wherein the temperature sensing device outputs a digital representation of the temperature.

6. The circuit of claim 2 wherein the parameter calculation device is comprised of a look-up table stored in memory comprising a plurality of temperature compensated word line bias voltages each with an associated temperature.

7. The circuit of claim 3 wherein the voltage generator is further comprised of a temperature invariant reference voltage source coupled to the digital-to-analog converter.

8. The circuit of claim 7 wherein the temperature invariant reference voltage source is a band-gap voltage reference circuit.

9. A temperature compensation apparatus in a memory device having operational voltages, the apparatus comprising:
a temperature sensing device for sensing a temperature of the integrated circuit and generating a digital representation of the temperature;
a logic circuit, coupled to the temperature sensing device, for generating a digital representation of an operational voltage and a digital representation of a timing signal both in response to the digital representation of the temperature;
a voltage generator, coupled to the logic circuit, for generating an analog operational voltage in response to the digital representation of the operational voltage; and
a timing generator, coupled to the logic circuit, for generating a logic signal in response to the digital representation of the timing signal.

10. The device of claim 9 wherein the operational voltages include word line voltages, and bit line voltages.

11. The device of claim 9 wherein the logic signal comprises a pair of pulses separated by a time indicated by the digital representation of the timing signal.

12. The device of claim 11 wherein a first pulse of the pair of pulses indicates a sensing start time and the remaining pulse of the pair of pulses represents a sensing end time.

13. The device of claim 11 wherein the digital representation of the timing signal indicates a time period between the pair of pulses.

14. A memory device comprising:
a memory array having a plurality of memory cells having rows coupled to word lines and columns coupled to bit lines;
a temperature compensation circuit, coupled to the memory array, for generating temperature compensated operational voltages, the circuit comprising:
a temperature sensor for generating a digital representation of a temperature of the integrated circuit;
a logic circuit, coupled to the temperature sensor, for generating digital representations of operational voltages in response to the digital representation of the temperature; and
an analog voltage generator, coupled to the logic circuit, for generating the temperature compensated operational voltages in response to the digital operational voltages.

15. The memory device of claim 14 wherein the memory array comprises one of a NAND or a NOR flash memory architecture.

16. The memory device of claim 14 wherein the memory device is a non-volatile memory.

17. The memory device of claim 14 wherein the memory device is a dynamic random access memory.

18. The memory device of claim 14 wherein the operational voltages include a word line voltage and a bit line voltage.

19. The memory device of claim 14 wherein the logic circuit is comprised of a memory controller for controlling operation of the memory device.

20. The memory device of claim 19 wherein the memory controller is adapted to execute a temperature compensation method comprising generating the digital representations of the operational voltages in response to the digital representation of the temperature.

21. A memory system comprising:
a microprocessor for controlling the system; and
a non-volatile memory device, coupled to the microprocessor, the memory device comprising:
a non-volatile memory array for storing data;
a temperature compensation apparatus coupled to the memory array, the apparatus comprising:
a temperature sensor for generating a digital representation of the temperature of the memory device;
a logic circuit, coupled to the temperature sensor, for generating a digital representation of an operational voltage and a digital representation of a timing signal both in response to the digital representation of the temperature;
a voltage generator, coupled to the logic circuit, for generating an analog operational voltage in response to the digital representation of the operational voltage; and
a timing generator, coupled to the logic circuit, for generating a plurality of pulses in response to the digital representation of the timing signal.

22. The memory system of claim 21 wherein the digital representation of the timing signal is a multiple bit word indicating a time period between the plurality of pulses.

23. A memory module comprising:
at least two non-volatile memory devices, each device comprising:
a memory array having a plurality of memory cells that operate in response to operational voltages;
a temperature compensating apparatus, coupled to the memory array, for generating the operational voltages, the apparatus comprising:
a temperature sensing device for sensing a temperature of the integrated circuit;

a logic circuit, coupled to the temperature sensing device, for generating a digital representations of the operational voltages that is a function of the temperature; and an analog voltage generator, coupled to the logic circuit, for generating the operational voltages in response to the digital representations of the operational voltages; and a plurality of contacts configured to provide selective contact between the memory devices and a host system.

24. The module of claim 23 wherein the at least two non-volatile memory devices are flash memory devices arranged in a NAND configuration.

25. A memory module comprising:

a non-volatile memory device, each device comprising:

a memory array having a plurality of memory cells that operate in response to operational voltages;

a temperature compensating apparatus, coupled to the memory array, for generating the operational voltages, the apparatus comprising:

a temperature sensing device for sensing a temperature of the integrated circuit;

a logic circuit, coupled to the temperature sensing device, for generating a digital representations of the operational voltages that is a function of the temperature; and an analog voltage generator, coupled to the logic circuit, for generating the operational voltages in response to the digital representations of the operational voltages;

a housing for enclosing the memory device; and a plurality of contacts coupled to the housing and configured to provide selective contact between the memory device and a host system.

26. The module of claim 25 wherein the memory device is a non-volatile USB memory device.

27. The module of claim 24 wherein the non-volatile memory device is a flash memory device.

28. A method for generating temperature compensated operation voltages in an integrated circuit adapted to perform a plurality of operations, the method comprising:

generating a digital representation of a temperature of the integrated circuit;

generating a digital representation of a bias voltage in response to the digital representation of the temperature; and generating an analog bias voltage from the digital representation of the bias voltage.

29. The method of claim 28 and further including:

receiving a command to perform a first operation of the plurality of operations, wherein the digital representation of the bias voltage is also generated in response to the first operation.

30. The method of claim 28 and further including:

generating a digital representation of a timing signal; and generating a logic signal in response to the digital representation of the timing signal.

31. The method of claim 30 and further including:

receiving a command to perform a first operation of the plurality of operations, wherein the digital representation of the timing signal is also generated in response to the first operation.

\* \* \* \* \*